(12) United States Patent
Cheung et al.

(10) Patent No.: US 7,314,673 B2
(45) Date of Patent: Jan. 1, 2008

(54) THIN FILM INFRARED TRANSPARENT CONDUCTOR

(75) Inventors: Jeffrey T. Cheung, Thousand Oaks, CA (US); Bruce K. Winker, Ventura, CA (US); Dong-Feng Gu, Thousand Oaks, CA (US); Paul H. Kobrin, Newbury Park, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 180 days.

(21) Appl. No.: 10/889,686

(22) Filed: Jul. 12, 2004

(65) Prior Publication Data

US 2005/0014033 A1 Jan. 20, 2005

Related U.S. Application Data

(63) Continuation-in-part of application No. 10/112,465, filed on Mar. 29, 2002, now Pat. No. 6,761,986.

(60) Provisional application No. 60/282,337, filed on Apr. 6, 2001.

(51) Int. Cl.
*B32B 9/00* (2006.01)
(52) U.S. Cl. .................. 428/701; 428/699; 428/702
(58) Field of Classification Search ............... 428/701, 428/702, 699, 432, 433
See application file for complete search history.

(56) References Cited

U.S. PATENT DOCUMENTS 6,072,117 A * 6/2000 Matsuyama et al. ........ 136/256
6,448,492 B1 * 9/2002 Okada et al. ........... 174/35 MS
6,761,986 B2 * 7/2004 Cheung ..................... 428/701

OTHER PUBLICATIONS

Coutts, TJ et al, "Search for improved transparent conducting oxides: A fundamental investigation of CdO, $Cd_2SnO_4$, and $Zn_2SnO_4$", J. Vac. Sci. Technol., A18,(6), p. 2646-2660, (Nov./Dec. 2000).
Baranov, AM. Et al, "Investigation of the properties of CdO films", Tech. Phys. Ltt. 23,(10), pp. 805-806 (Oct. 1997).
Ferro, R et al.: "F-Doped CdO Thin Films Deposited by Spray Pyrolysis", PMS. State. Sol. (a) 177, P477, 480-483(2000).
Subramanyam, T.K. et al., "Preparation and characterization of CdO films deposited by dc magnetron reactive sputtering", *Materials Letters*, vol. 35, pp. 214-220, (May 1998).
Subramanyam, T.K. et al "Influence of Oxygen Pressure on the Structural and Optical Properties of DC Magnetron Reactive Sputtered Cadmium Oxide Films", Physica Scripta, vol. 57, p. 317-320, (1998).

(Continued)

*Primary Examiner*—G. Blackwell
(74) *Attorney, Agent, or Firm*—Koppel, Patrick, Heybl & Dawson (57) ABSTRACT

A cadmium oxide (CdO) film doped with any of the Group III elements is substantially transparent to radiation between about 0.7 μm and 12 μm. A film made according to the invention having a sheet resistance of <600Ω/□ will also have exceptionally low optical absorption throughout the IR range. The film is suitably employed as transparent, electrically conductive electrodes, and can be used in devices such as liquid crystal cells for beam steering, spatial light modulators, optical switches for fiber optical communications, switchable and/or tunable polarization modification components, and top transparent electrodes for SWIR (1.3 and 1.5 μm) VCSELs.

13 Claims, 11 Drawing Sheets

OTHER PUBLICATIONS

Murphy, L.C.S. & Rao, K.S.R.K., "Thickness dependent electrical properties of CdO thin films prepared by spray pyrolysis method", *Bulletin of Material Science*, vol. 22, No. 6, pp. 953-957 (Oct. 1999).

Chu, T.L. et al, "Degenerate Cadmium Oxide Films for Electronic Devices", J. Electronic Materials, vol. 19, No. 9, pp. 1003-1005 (1990).

Tanaka, K. et al., "Electrical and Optical Properties of Sputtered CdO Films", Japanese Journal of Applied Physics, vol. 8, No. (6), pp. 681-691 (Jun. 1969).

Varkey, A.J. et al., "Transparent conducting cadmium oxide thin films prepared by a solution growth technique", Thin Solid Films, 239, pp. 211-213 (1994).

Phatak, Girish et al., "Deposition and properties of cadmium oxide films by activated reactive evaporation", Thin Solid Films, 245, pp. 17-26 (1994).

Shaganov, I.I., et al., "Obtaining transparent oxide conducting coatings by pulsed laser sputtering", Sov. J. Opt. Technol. 48(5) pp. 280-282 (May 1981).

Minami, Tadatsugu, "New n-Type Transparent Conducting Oxides", 25, (8), pp. 38-44 (Aug. 2000).

"Pulsed Laser Deposition of Thin Films", Chrisey, pp. 3, 23-72, 255-263, 327-354, 1994.

"Handbook of Deposition Technologies for Films and Coatings", Second Edition, Noyes Publications, Bunshah, R.F., pp. 1-2, 167, 187-197, 249-311, 434-456, 320-324, 374-429, 469-471, (1994).

\* cited by examiner

THIN FILM INFRARED TRANSPARENT CONDUCTOR

This application claims the benefit of U.S. Provisional Application, Ser. No. 60/282,337 filed Apr. 6, 2001, and is a continuation-in-part of Ser. No. 10/112,465 filed Mar. 29, 2002 now U.S. Pat. No. 6,761,986.

BACKGROUND OF THE INVENTION

1. Field of the Invention

This invention relates to transparent conductive thin films for use in electro-optical devices.

2. Description of the Related Art

Figure 4:
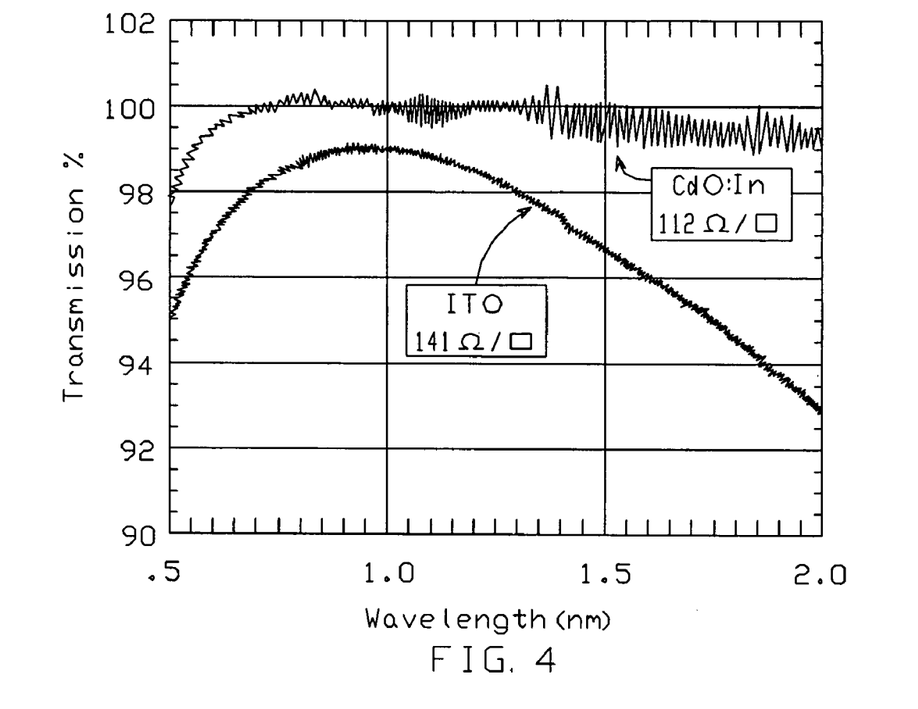
FIG. 4 is a plot comparing the transmission of a CdO:In film per the present invention with a prior art ITO film of comparable sheet resistance for wavelengths from 0.5 to 2.0 µm.

Many electro-optical devices operating in the infrared (generally, wavelengths of ~0.7 μm to ~14 μm) require conductive thin films that are extremely transparent. Such devices include liquid crystal cells for beam steering, spatial light modulators, and optical switches for fiber optic communications, switchable and/or tunable polarization modification components, and long wavelength vertical cavity surface emitting lasers (VCSELs). Conventional transparent conductive oxides such as indium tin oxide (ITO), zinc oxide (ZnO), and tin oxide ($SnO_2$) cannot fulfill the requirements of these applications. These materials are mostly transmissive in the visible; however, transmission in the infrared drops due to free carrier absorption. The transmission values versus wavelength for an ITO film on a glass substrate are shown in FIG. 4. For ITO films with a sheet resistance of about 140Ω/□ the transmission is about 98% at 1.3 μm and about 97% at 1.5 μm; 1.3 μm and 1.5 μm are critical values for fiber-optic communication and long wavelength VCSEL applications. Other possible optically transparent conductive materials such as doped semiconductor wafers or epitaxial layers (Si, Ge, GaAs, InP doped) have limited utility because they do not cover the entire spectral range, have a limited size, and are expensive.

U.S. Pat. No. 6,458,637, issued Oct. 1, 2002 to Jeffrey T. Cheung, directed to transparent and conductive zinc oxide films, describes the introduction of hydrogen or a hydrocarbon gas (in addition to oxygen) into the vacuum chamber during growth of the film using pulsed laser deposition from a 2.0 atomic wt. % gallium-doped ZnO target. This approach incorporated hydrogen atoms into the ZnO lattice during growth and activates them to behave as electron donors so that a low electrical resistivity film ($0.9-3\times10^{-4}$ Ω-cm) could be grown at low temperature. The process was found to work only when gallium was also present in the lattice. The resultant films, with or without doping, had a transmissivity of no more then about 90% at wavelengths of 0.35 to 2.0 μm.

Cadmium oxide (CdO) films doped with indium (CdO:In) have been prepared in the past for flat-panel displays and solar cells which require high transparency to visible light. However, these films are well known for their toxicity, and therefore the prior art has steered away from developing such films. Minami et al. reports that CdO:In films have been prepared with a resistivity of the order of $10^{-5}$ Ω-cm for flat-panel displays and solar cells, but he states that they are of no practical use because of Cd toxicity. (Minami, Tadatsugu, "New n-Type Transparent Conducting Oxides", *Transparent Conducting Oxides*, Volume 25, No. 8, August 2000, p. 38). Further, because these films have a yellow color, which differentiates them from prior art transparent films that are clear in appearance, one skilled in the art would be steered away from using these films for any applications requiring transparent films.

Undoped CdO has been prepared by sputtering, MOCVD, and spray pyrolysis (Murthy, L. C. S. & Rao, K. S. R. K., "Thickness Dependent Electric Properties of CdO Thin Films Prepared by Spray Pyrolysis Method," *Bulletin of Material Science*, Vol. 22, No. 6, pp. 953-957 (October 1999); Subramarnyam, T. K et al., "Preparation and Characterization of CdO Films Deposited by DC Magnetron Reactive Sputtering", *Materials Letter*, Vol. 35, pp. 214-220, (May 1998); Baranov, A M et al., "Investigation of the Properties of CdO Films", *Tech. Phys. Ltr*, 23, (10) pp. 805-806 (October 1997)). Transmission no greater then about 85% has been reported in the wavelength range of 0.6-1.6 μm.

Representative data, doping and method of fabrication for these references, along with additional references reporting on CdO films, are listed in Table 1 below.

TABLE 1

LITERATURE REPORTING ON CDO FILMS

| Approach | Dopant | Substrate | Thick. Å | Growth Temp | Resistivity Ohm-cm | T % & range |
|---|---|---|---|---|---|---|
| Pulsed Laser Sputtering[1] | Intrinsic* | Glass | | R. T. + post annealing | $>10^{-3}$ | 60-90% @ 0.5-2.0 μm |
| Activated Reactive Evaporation[2] | Intrinsic* | Glass | | 350 | $4 \times 10^{-4}$ | 70-80% @ 0.5-.85 μm |
| Solution Growth[3] | Intrinsic* | Glass | 2000 | R. T. + post annealing | $2-5 \times 10^{-4}$ | 75-85% @ 0.5-0.9 μm |
| Ion beam sputtering[4] | Intrinsic* | Glass | 5000 | 50-70 C. | $5 \times 10^{-3}$ | 70-80% @ 0.5-.85 μm** |
| Spray pyrolysis[4] | Intrinsic* | Glass | 5000 | 180-225 | $2-5 \times 10^{-3}$ | 70-80% @ 0.5-.85 μm** |
| DC reactive sputtering[5] | Undoped | Glass | | R. T. + post annealing | $10^2$-$10^{-3}$ | 40-85% @ 0.5-.90 μm |
| [6]sputtering Spray Pyrolysis[7] | Indium Undoped | | | | $10^{-5}$ | |
| DC Magnetron Reactive Sputtering[8,9] | Undoped | Glass | | | 5-49 | 85% @ 0.6-1.6 μm |
| Magnetron Sputtering[10] | Undoped | | | | $>7 \times 10^{-4}$ | 60-70% @ 0.5-0.9 μm |

TABLE 1-continued

LITERATURE REPORTING ON CDO FILMS

| Approach | Dopant | Substrate | Thick. Å | Growth Temp | Resistivity Ohm-cm | T % & range |
|---|---|---|---|---|---|---|
| Spray Pyrolysis[11] | Fluorine | | | | | 80-90% @ 0.4-0.7 µm; <80% @ >0.7-1.2 µm |
| Low Press. CVD[12] | Undoped | Glass | 500-800 | | $2 \times 10^{-3}$ | |

*Intrinsic dopant means that donors in the materials are due to defects not impurities
**Measured against glass slide as reference
[1]Shaganov, II, et al., "Obtaining transparent oxide conducting coatings by pulsed laser sputtering" Sov. J. Opt. Technol. 48(5), p 280-282 (May, 1981)
[2]Pahtak, Girish et al, "Deposition and properties of cadmium oxide films by activated reactive evaporation", Thin Solid Films, 245, p 17-26 (1994)
[3]Varkey, A J et al, "Transparent conducting cadmium oxide thin films prepared by a solution growth technique", Thin Solid Films, 239, p 211-213 (1994)
[4]Chu, T L et al, "Degenerate Cadmium Oxide films for electronic devices", J. Electronic Materials, 19, p 1003-1005 (1990)
[5]Tanaka, K et al "Electrical and optical properties of sputtered CdO films", Japanese J. of Appl. Phys., 8(6), p 681-691 (June 1969)
[6]Minami, Tadatsugu, "New n-Type Transparent Conducting Oxides", Transparent Conducting Oxides, 25, (8), p 38-44 (August 2000)
[7]Murthy, L. C. S. et al., "Thickness Dependent Electric Properties of CdO Thin Films Prepared by Spray Pyrolysis Method", Bulletin of Material Science, 22, (6), pp 953-7 (Oct. 1999)
[8]Subramarnyam, T. K et al, "Preparation and Characterization of CdO Films Deposited by DC Magnetron Reactive Sputtering", Materials Letter, 35, pp 214-220, (May 1998)
[9]Subramarnyam, T. K et al, "Influence of Oxygen Pressure on the Structural and Optical Properties of DC Magnetron Reactive Sputtered Cadmium Oxide", Physica Scripta, 57, p 317-320 (1998)
[10]Baranov, A M. et al, "Investigation of the Properties of CdO Films", Tech. Phys. Ltr, 23, (10) pp 805-806 (October 1997)
[11]Ferro, R et al "F-Doped CdO Thin Films Deposited by Spray Pyrolysis", PMS. State. Sol. (a) 177, P 477-483 (2000)
[12]Coutts, T J et al, "Search for improved transparent and conducting oxides: A fundamental investigation of CdO, $Cd_2SnO_4$, and $Zn_2SnO_4$", J Vac. Sci. Tech., A18, (6), p 2646-2660, (November/December 2000)

There is a need for films with lower resistivity and low optical absorption at wavelengths that extend from the short-wavelength infrared (SWIR) (1-2 µm) through the mid-wavelength infrared (MWIR) (3-5 µm) and possibly into the long wavelength infrared (LWIR) (8-12 µm). As an example, devices operating in the fiber telecommunication bands at 1.3 or 1.5 µm require an optical transmission of at least 99%.

SUMMARY OF THE INVENTION

A doped cadmium oxide (CdO) film with high optical transmission and suitable electrical conductivity has been developed for use in applications requiring conductive, infrared transparent films. Suitable dopants for the film include any of the Group III elements (i.e. boron, aluminum, gallium, indium or thallium), bismuth, fluorine, and hydrogen (as a co-dopant) if properly processed.

The new doped film is substantially transparent to infrared radiation in the range of between about 0.7 µm and 14 µm. Films made according to the invention have a sheet resistance of <600Ω/□ (typically ≦200Ω/□), and have exceptionally low optical absorption throughout the IR range: less than 4% (typically <1%) in the SWIR, less than 10% (typically <3%) in the MWIR, and less than 20% (typically <4%) in the LWIR. In addition, a film per the present invention having a sheet resistance of <600Ω/□ (typically ≦200Ω/□) has an absorption loss of about ≦0.2% at 1.3 µm and ≦0.5% at 1.5 µm. Films made according to the invention have a resistivity of less than $5 \times 10^{-4}$ Ω-cm. Low resistivity films per the present invention can be prepared at much lower temperatures (20° C.) by co-doping with hydrogen.

There are numerous applications for such films functioning as transparent, electrically conductive electrodes, including (but not limited to) liquid crystal cells for beam steering, spatial light modulators, optical switches for fiber optical communications, switchable and/or tunable polarization modification components, top transparent electrodes for SWIR (1.3 and 1.51 µm) VCSELs, Pockels' cells, MEMs devices, and ferroelectric cells. Other applications include radio frequency shielding of windows that can transmit infrared radiation.

BRIEF DESCRIPTION OF THE DRAWINGS

These and other features and advantages of the invention will be apparent to those skilled in the art from the following detailed description, taken together with the accompanying drawings, in which.

DETAILED DESCRIPTION OF THE INVENTION

A doped Cadmium Oxide (CdO) film has been developed for use primarily in applications requiring conductive, infrared transparent films. Suitable dopants for the film include any of the Group III elements (i.e. boron, aluminum, gallium, indium or thallium), bismuth, fluorine, and hydrogen (as a co-dopant). In addition, hydrogen and a group III element such as indium can be used simultaneously as co-dopants to lower the growth temperature of transparent and electrically conductive films. These dopants are believed to increase the electron concentration of CdO, thus making it more conductive.

There are numerous applications for the film, including:
1) transparent conductive electrodes for liquid crystal cells used in beam steering, spatial light modulators, and optical switches, particularly optical switches operating in the infrared spectral range up to 14 μm wavelength
2) Improved shielding from Electromagnetic (EM) or Radio Frequency (RF) interference
3) Top electrodes for SWIR VCSELs
4) Pockels' cells
5) MEMs devices
6) Transparent conductive electrodes for devices based on ferroelectric materials, such as non-volatile memory and electro-optic devices While not requiring the transparent properties of the CdO film, the present films can also be used in electrodes for piezoelectric devices.

The terms "sheet resistance" and "resistivity" are used herein; they are defined as follows. Resistance (R) is electrical resistance measured between two contacts on an electrically conductive material of any shape and thickness. It is not a quantitative description of material property. The unit of resistance is the ohm (Ω).

Resistivity (ρ), also known as specific resistance, is the resistance measured across the opposite faces of a 1 cm×1 cm×1 cm cubic shaped material. The unit of resistivity is the Ω-cm. This quantity depends only on the fundamental property of a thin film material; i.e., it does not depend on its thickness. However, as will be discussed below, sometimes the resistivity of a thin film is different near the initial growth interface.

Sheet resistance ($R_s$) is a quantity that is often used to describe the conducting thin film or layers in a device (e.g., the RF shield and electrodes for liquid crystal and ferroelectric devices). It is expressed in units of Ω/□ and is dependent on thickness "d". It is related to resistivity (ρ) by the following relationship: $\rho = R_s \times d$, with d specified in cm.

Films made according to the invention have a sheet resistance of <600Ω/□ (typically ≦200Ω/□), and have exceptionally low optical absorption throughout the IR range: less than 4% (typically <1%) in the SWIR, less than 10% (typically <3%) in the MWIR, and less than 20% (typically <4%) in the LWIR. In addition, a film per the present invention having a sheet resistance of <600Ω/□ (typically ≦200Ω/□) has an absorption loss of about ≦0.2% at 1.3 μm and ≦0.5% at 1.5 μm. Films made according to the invention have a resistivity of less than $5 \times 10^{-4}$ W-cm.

The film can be grown on any suitable substrate such as MgO, glass, quartz, sapphire, silicon, AlON, spinel, ZnSe, ZnS, GaAs, Ge, etc. Many methods are known for growing Group III element doped CdO films, including metal organic chemical vapor deposition (MOCVD), spray pyrolysis, sol-gel, vapor transport, hot wall epitaxy, close-space vapor transport, plasma-enhanced chemical vapor deposition (PECVD), sputtering, activated reactive evaporation, ion-assisted deposition, and pulsed electron-beam evaporation (see e.g., *Handbook of Deposition Technologies For Films and Coatings*, Second Edition, Noyes Publications, Bunshah, R. F. pp. 187-197, 249-311, 434-456, 320-324, 374-429, 469-471 (1994)). However, to obtain the combination of low electrical resistivity and high optical transmissivity described herein, the present invention requires that the film be formed using a method which "activates" the dopants.

A preferred method is pulsed laser deposition (PLD) since it allows for accurate control of the film composition and thickness, and facilitates the activation of dopants. This method is described in great detail in, e.g., "Pulsed Laser Deposition of Thin Films", Chrisey, pp. 23-72, 255-263, 327-354 (1994). Specifically, the experimental set up comprises a target holder and a substrate holder housed in a vacuum chamber. A well-blended mixture of the material to be vaporized and condensed on the substrate is placed in the target holder. A high-power laser used as an external energy source is focused on the target to vaporize the mixture in a controlled manner. Various optical components are used to focus and raster the laser beam over the target surface. (see "Pulsed Laser Deposition of Thin Films", Chrisey, 1994, p. 3). Absorption characteristics of the material to be evaporated determine the laser wavelength to be used. Pulse width, repetition rate, and pulse intensity are selected for specific applications. (see Bunshah, pg. 167). The thickness of the film can be controlled by varying the pulse repetition rate and distance of the target. The PLD process has been used to produce films having a thickness between 100-4000 Å. The composition of the grown film is substantially the same as that of the target composition.

For preparation of the CdO film incorporating features of the invention, a preferred composition contains from about 0.5%, to about 6% by weight of the dopant. However, films with suitable properties can be obtained with indium concentrations as low as 0.05% (atomic weight). Films with 0.5-6.0% indium exhibit excellent optical properties up to a wavelength of about 2.0 µm, beyond which the free carrier absorption becomes dominant. By reducing the doping concentration to about 0.05% (atomic wt.) of indium, optical transmission is improved at longer wavelengths.

The films can be grown at temperatures from about 20° C. to about 425° C. The substrate temperature affects the quality of the film with higher temperature producing a film with higher electrical conductivity and optical transparency in the infrared and visible range. An exemplary procedure for growth of a doped CdO film per the present invention is set forth in the example below.

EXAMPLE 1

Growth of Indium Doped CdO ("CdO:In") by PLD

A ceramic target comprising $In_2O_3$ and CdO was placed in the target holder of the PLD chamber about 10 inches away from an MgO substrate. The target was prepared by mixing 1% by weight $In_2O_3$ powder with 99% by weight CdO powder in a jar, filling the jar with a quantity of methanol approximately equal in volume to the CdO/$In_2O_3$ mixture to form a slurry, and adding a like volume of ceramic beads (approximately 1 cm in diameter) to the mixture. The mixture was then "rolled" for 24 hours, the process being known as "ball milling". The methanol was then evaporated from the mixture and the beads were sifted out. The remaining powder was pressed into a cylindrical shape and sintered in a high temperature furnace (about 1100° C.) to form a ceramic target.

The target was then placed in a vacuum chamber having an $O_2$ partial pressure of approximately 5-50 millitorr and the temperature of the substrate was raised to 440° C. The target was irradiated using a Kr:F excimer laser beam having a wavelength of 248 nm with a pulse energy of 390 mJ/pulse at a frequency of 5 pulses/sec. The energy delivered by the laser was 1 J/cm$^2$ with a pulse duration of 32 ns. Other excimer laser types, such as fluorine, ArF, and XeCl, or a Q-switched Nd:YAG laser with frequency quadrupler that delivers high energy pulsed UV output, might also be used.

Figure 1:
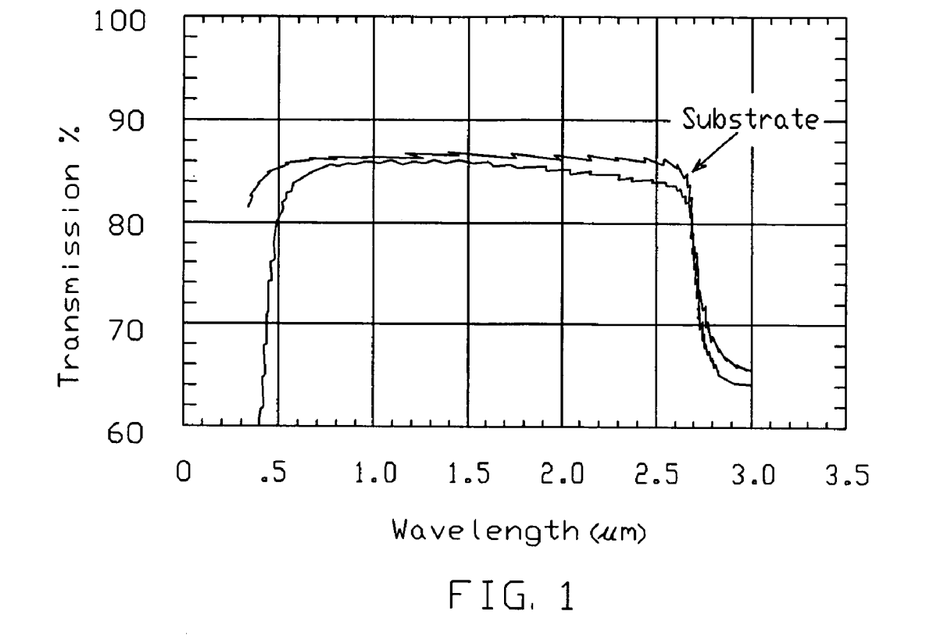
FIG. 1 is a plot showing the spectral transmission data for a CdO:In film per the present invention compared to the transmission of the substrate upon which it is deposited.
Figure 2:
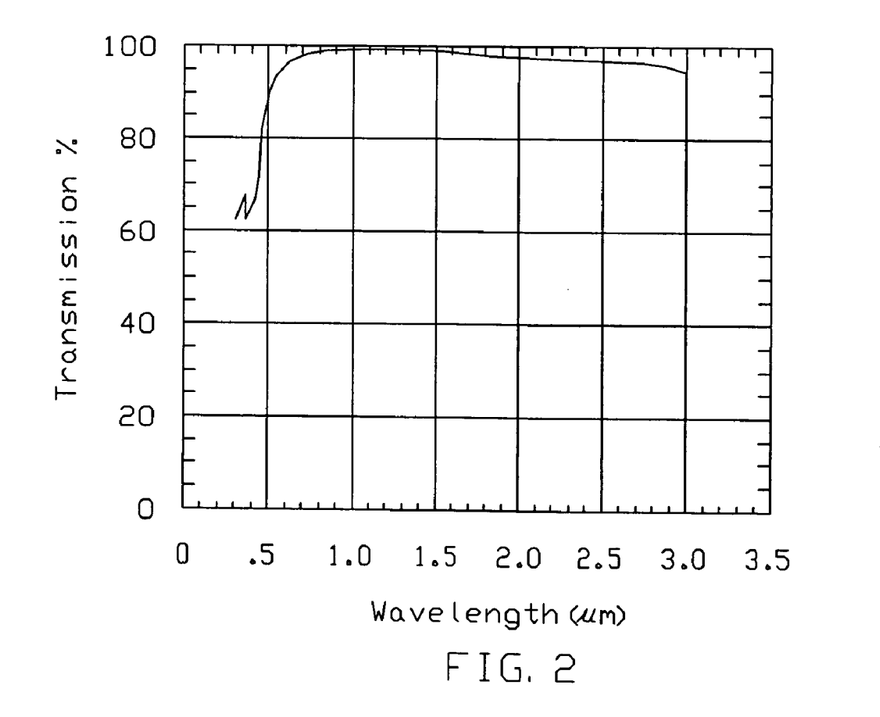
FIG. 2 shows the transmission of the film of FIG. 1 normalized by the transmission of an uncoated substrate for the range of 0.5 to 3.0 µm.
Figure 3A:
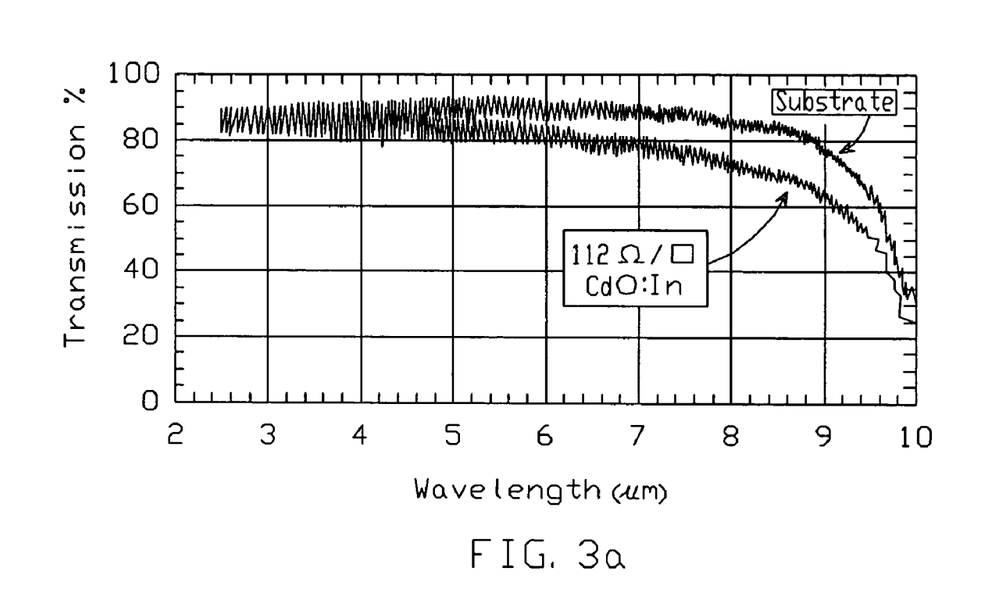
FIG. 3a is a plot showing transmission versus wavelength for a CdO:In film per the present invention on a MgO substrate for wavelengths from 2.5 to 10 µm.
Figure 3B:
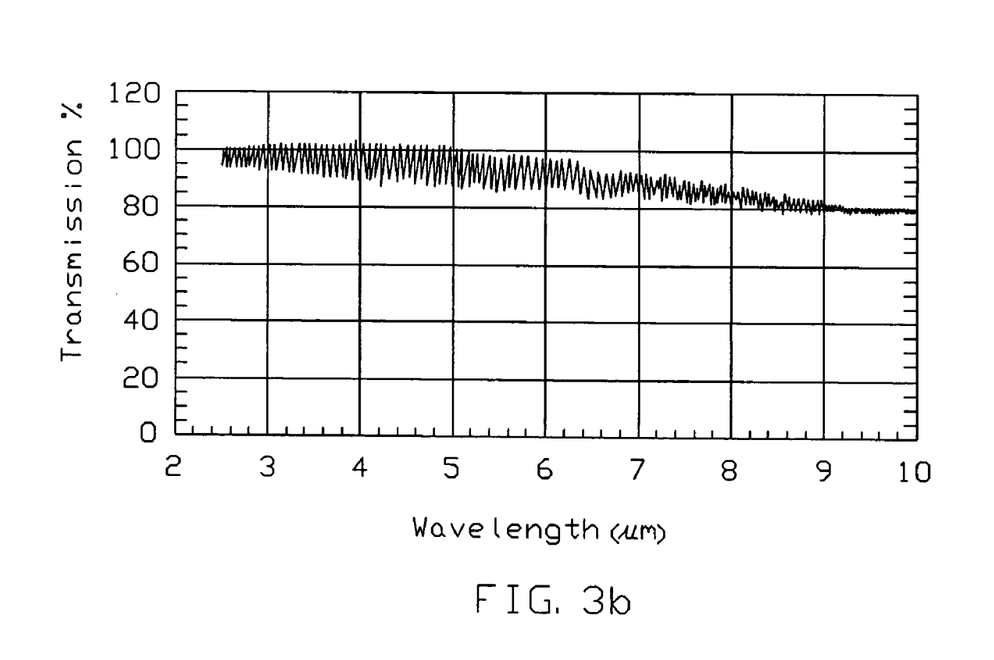
FIG. 3b is a plot showing the transmission of the film of FIG. 3a, normalized by the transmission of an uncoated substrate.

Electrical conductivity was determined using a four-point probe measurement. The CdO:In film was found to have a sheet resistance of 112Ω/□ and exceptionally high transmission as shown in FIG. 1-5. The transmission of the film shown in FIG. 2 was determined by measuring the transmission of the substrate and dividing the combined transmission measured for the film and substrate together by the transmission of the substrate alone (see FIG. 1). FIGS. 3a and 3b are plots showing transmission versus wavelength for the CdO:In film for a portion of the IR range. The upper curve of FIG. 3a shows the transparency of the MgO substrate without the film, and the lower curve of FIG. 3a shows the transparency of the film and substrate combination. FIG. 3b shows the film transmission obtained by dividing the transmission of the film and substrate combination by the transmission of an uncoated substrate. FIGS. 3a and 3b shows transmission for wavelengths between 2.5 to 10 µm. As can be seen, the doped CdO film is nearly 100% transparent at the lower wavelengths, and still around 80% transparent at 10 µm. At the longer wavelengths in this range, most of the transmission is lost to reflection and not to absorption.

Figure 5:
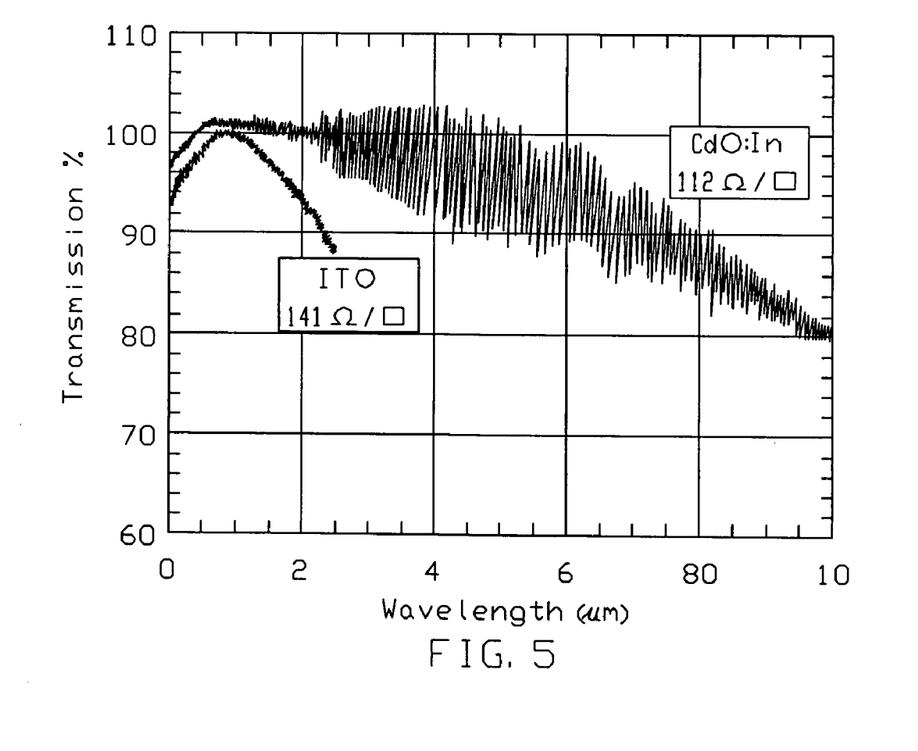
FIG. 5 is a combination of FIGS. 3b and 4 for wavelengths of 0.5 to 10 μm.

In FIG. 4, the transmission of the CdO:In film is compared to a prior art ITO film (on a glass substrate). FIG. 5 shows FIGS. 3b and 4 combined. Both films have a comparably low sheet resistance (112Ω/□ for the CdO:In film, and 141Ω/□ for the ITO film). However, the transmission for the ITO film is significantly less than the transmission for the CdO:In film. As can be seen from the figures, the transmission for the ITO film peaks at about 99% at approximately 1.0 µm but then drops significantly for light of longer wavelength. Note that where transmission exceeds 100%, the film is acting as an antireflective (AR) coating. In contrast, the transmission of the CdO:In films remains constant at around 100% throughout the 0.5 to 2.0 µm range. In addition, transmissivity for the CdO:In film remains significantly high for wavelengths up to 10 µm. (The oscillations in the transmission values shown in the figures such as FIG. 5 above about 2 µm are caused by optical interference between the front and back of the substrate). Of particular significance is the high transmission values for the CdO:In films obtained at 1.3 and 1.5 µm, which are bands used in fiber optic communication systems.

Figure 6:
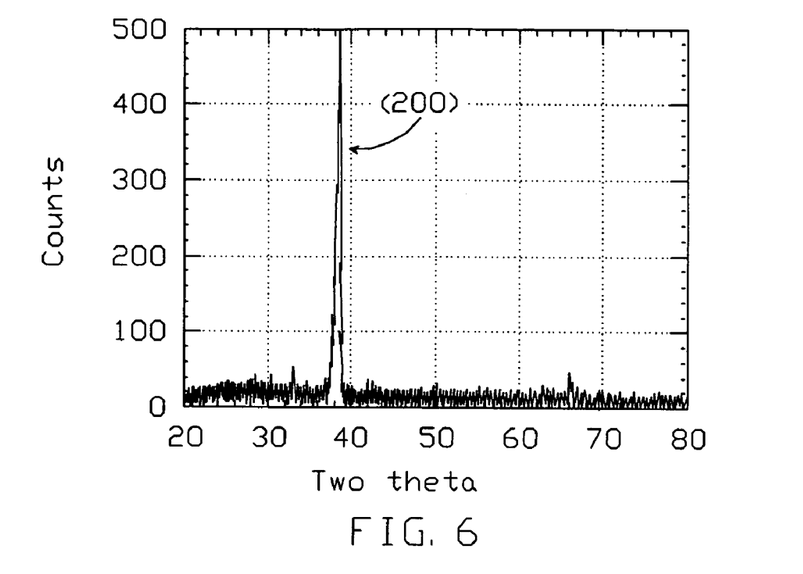
FIG. 6 shows the x-ray diffraction pattern for a CdO:In film per the present invention.

FIG. 6 is a plot showing X-ray diffraction data for a CdO:In film prepared using the process described above. The material is crystalline and has the same x-ray peaks as an undoped CdO film with a (200) crystalline orientation.

An alternative method of contrasting indium-doped CdO films with prior known conductive films is to compare the real refractive index (n) and the imaginary refractive index (k) of both. The complex refractive index ($\bar{n}$) is the sum of the real refractive index, n (the real part of the complex refractive index), and the imaginary part of the complex refractive index, which is the extinction coefficient, k, according to the formula $\bar{n}=n+ik$. The absorption coefficient, α, is obtained from the following relationship:

$$T=I/I_0=e^{-\alpha d}$$

Where $\alpha=4\pi k/\lambda$, λ=wavelength, d=thickness of the film, and $I/I_0$=light incident/light transmitted.

Figure 7:
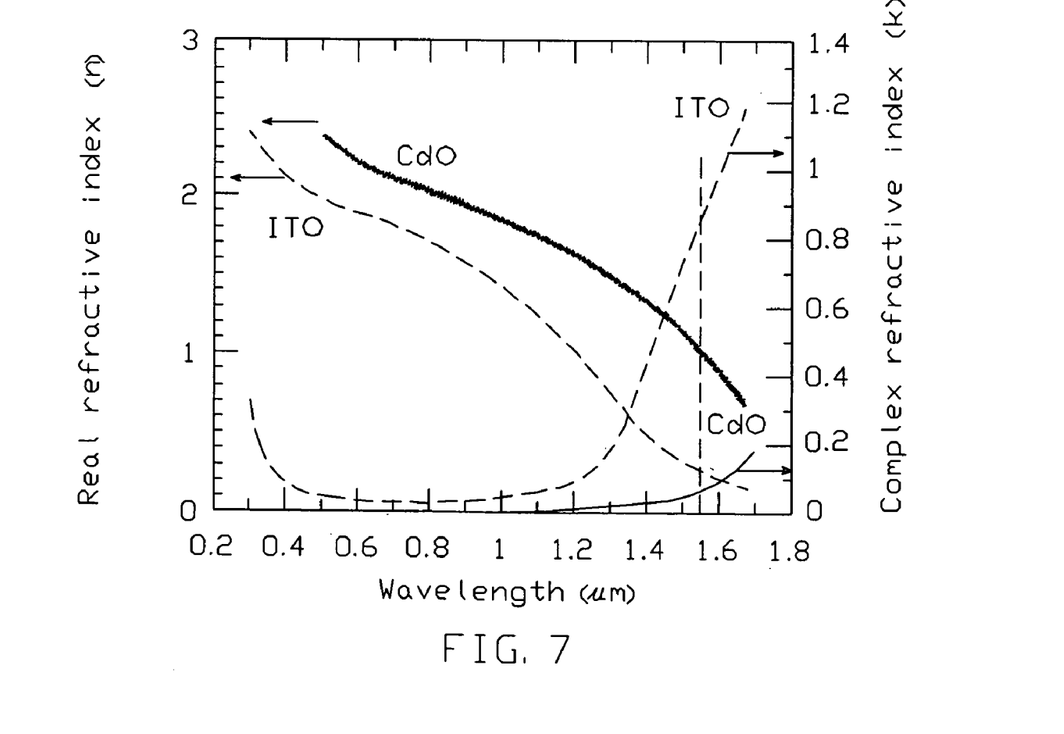
FIG. 7 is a graph comparing the refractive index of the present CdO:In film with that of an ITO film.

FIG. 7 shows the real and imaginary refractive indices, as measured by variable angle spectroscopic ellipsometry, for 2% indium-doped CdO and ITO films. At a preferred operating wavelength of 1.5 µm, the real refractive index of the doped CdO film is about 4 times that of the ITO film (1.3 vs. 0.33). In contrast, the imaginary refractive index (k), which allows comparison with performance normalized to eliminate variables such as thickness, shows a value 18 times less (0.05 vs. 0.9) for the doped CdO film.

Figure 8:
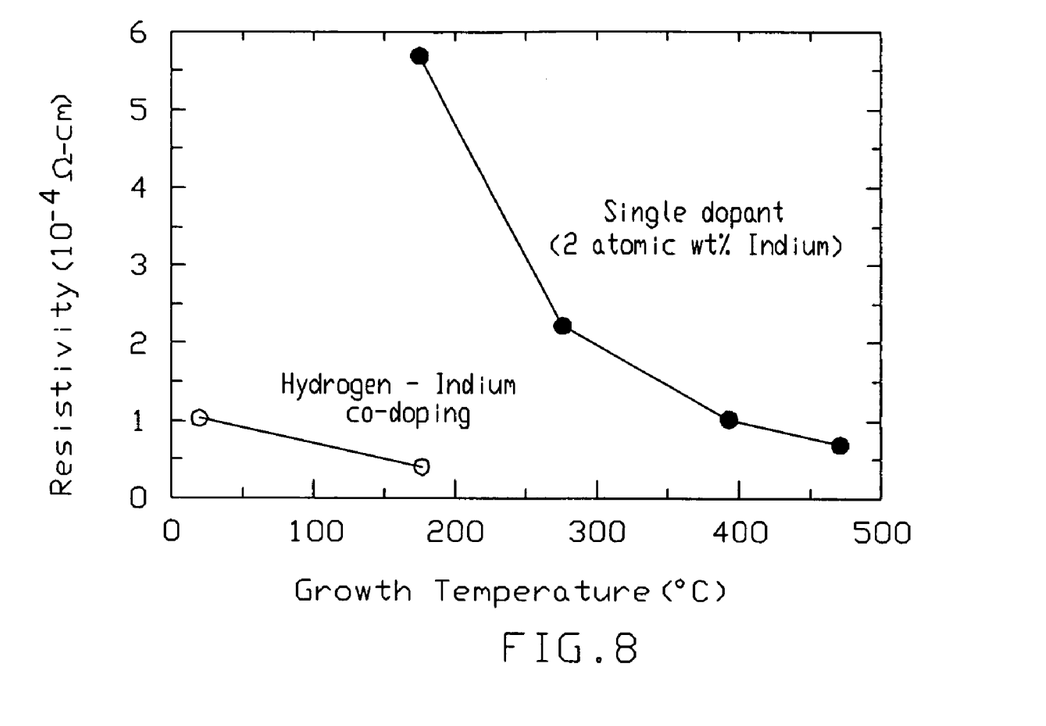
FIG. 8 is a graph showing the resistivity of a CdO:In film and a CdO:In film co-doped with hydrogen, formed at various temperatures.

Hydrogen doping or co-doping, accomplished by adding $H_2$ or $CH_4$ in the chamber atmosphere during film production, allows growth of low resistivity and highly transparent films such as described herein, at lower temperatures (approximately 200° C. and lower). FIG. 8 shows the electrical resistivity of CdO films grown under different temperature and two different doping conditions. Films with an indium dopant were grown using pulsed laser deposition in 15 mTorr of oxygen. It appears that film properties are not sensitive to these levels as long as it is controlled within a range from 5 mTorr to 50 mTorr. A CdO target containing 2% (atomic wt.) of indium was used. The electrical resistivity of the resultant films increases with a decrease in growth temperature. However, when 20 mTorr of hydrogen gas or $CH_4$ was introduced into the vacuum chamber during growth, a much lower resistivity film was produced at a lower growth temperature. For example, the resistivity of a film grown at 175° C. was lowered by one order of magnitude from $5.5 \times 10^{-4}$ Ω-cm to $5 \times 10^{-5}$ Ω-cm by adding hydrogen gas or $CH_4$ during growth. The resistivity of a film grown at room temperature in the presence of hydrogen or $CH_4$ is $1 \times 10^{-4}$ Ω-cm, which is lower than any other known transparent conducting films grown at the same temperature.

Figure 9:
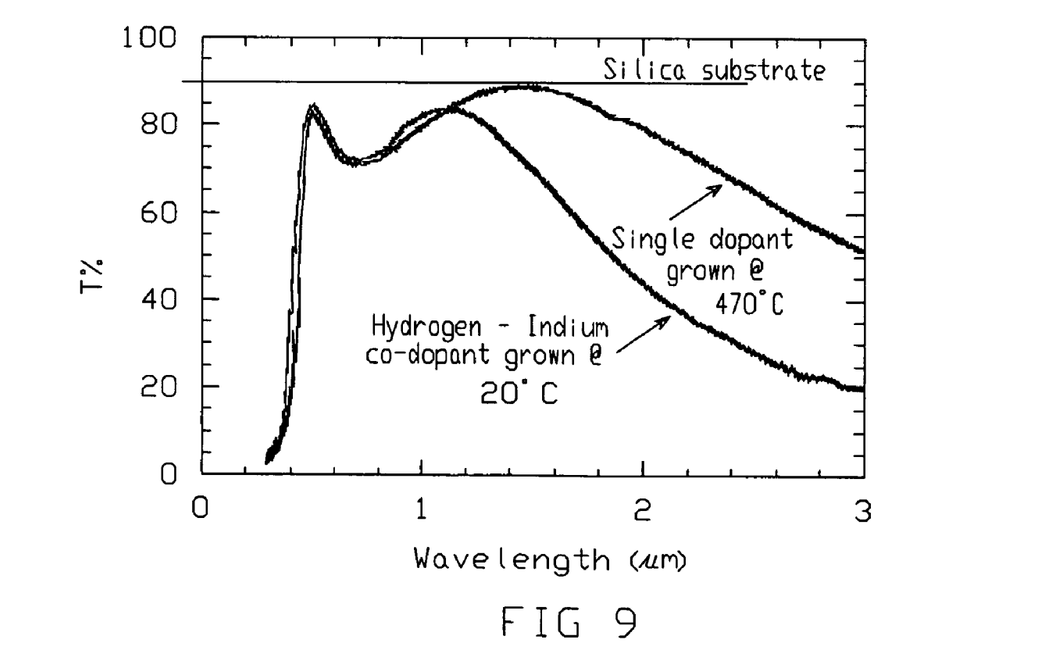
FIG. 9 is a graph comparing the optical transmission of In and In:H co-doped CdO films per the present invention.

FIG. 9 compares the optical transmission of two CdO films. One film is doped with 2% Indium and grown at 475° C. The other film is CdO doped with hydrogen-indium grown at 20° C. The electrical resistivities of the two films are quite similar ($6.5 \times 10^{-5}$ Ω-cm for the indium 475° C. film, and $1.1 \times 10^{-4}$ Ω-cm for the In:H 20° C. film). While the co-doped film grown at 20° C. shows more optical loss in the spectral range beyond 1.1 µm, between 0.5 and 1.1 µm the difference between the two films is negligible.

This data demonstrates that co-doping with hydrogen provides the capability of producing low resistivity films at much lower temperatures. These films may have a slight, but acceptable, optical loss at wavelengths greater than 1.1 microns.

Gallium doped CdO has similar properties to the Indium doped CdO. Other Group III elements should provide similar properties, as should bismuth and fluorine.

Figure 10:
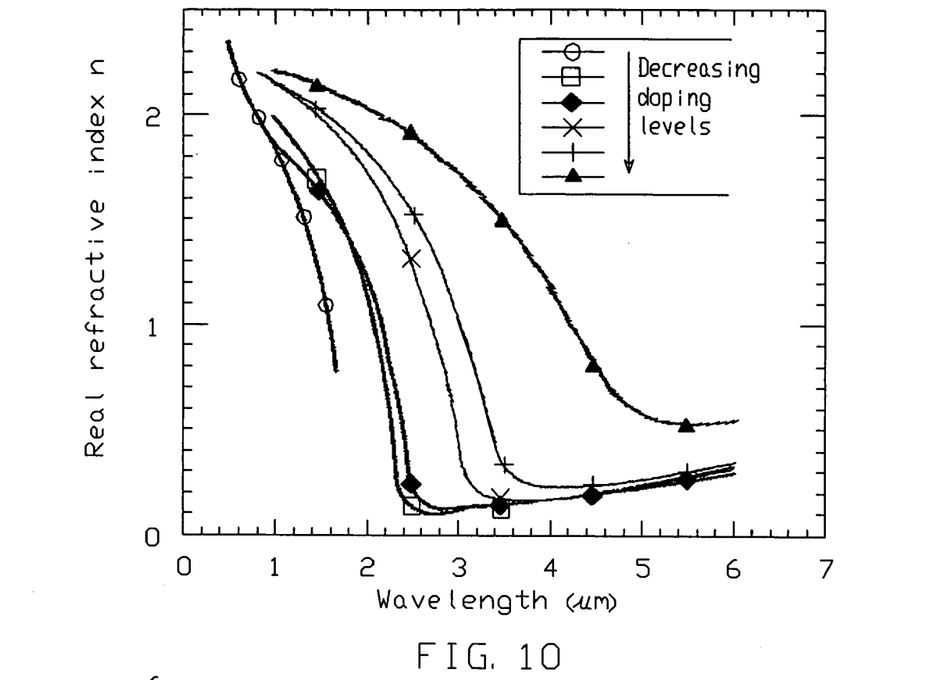
FIG. 10 is a graph showing real refractive indices versus wavelength for CdO:In films per the present invention which have different concentrations of indium.
Figure 11:
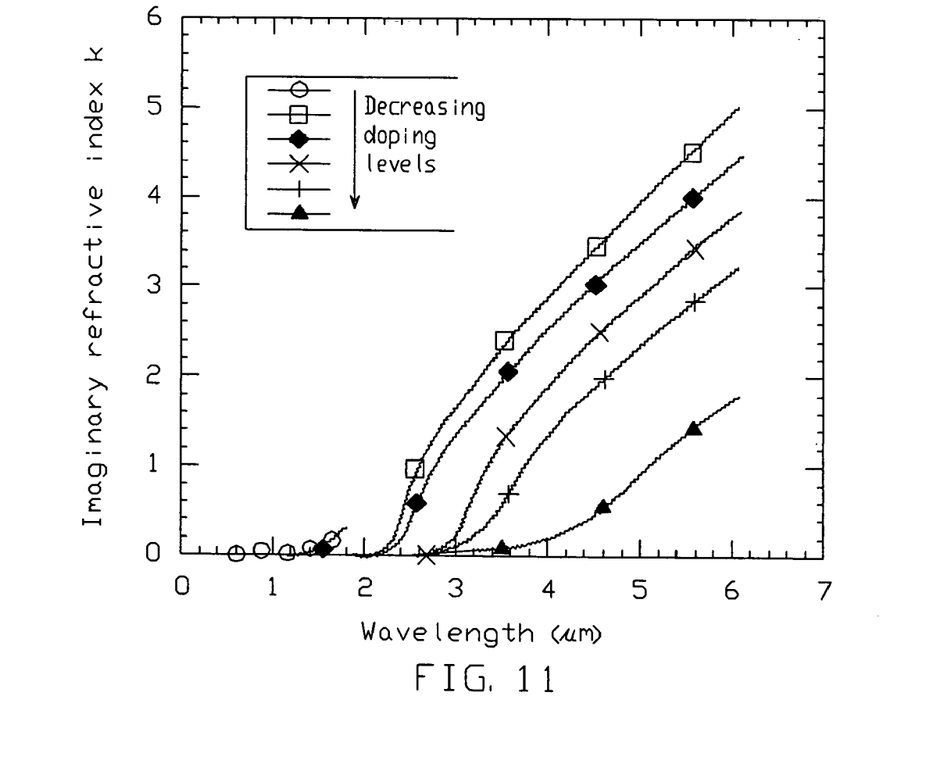
FIG. 11 is a graph showing imaginary refractive indices versus wavelength for CdO:In films per the present invention which have different concentrations of indium.

FIG. 10 shows the real refractive indices for six different concentrations of indium, at wavelengths of from about 0.45 µm to about 5.5 µm. As the indium concentration is increased, the dispersion shifts toward longer wavelengths. For comparison, FIG. 11 shows the imaginary refractive index, k, for films with the same indium concentrations. As the indium concentration is decreased, the optical loss edge shifts toward longer wavelengths. This suggests that the useful spectral range also shifts to higher wavelengths with a decrease in indium concentration.

Figure 12:
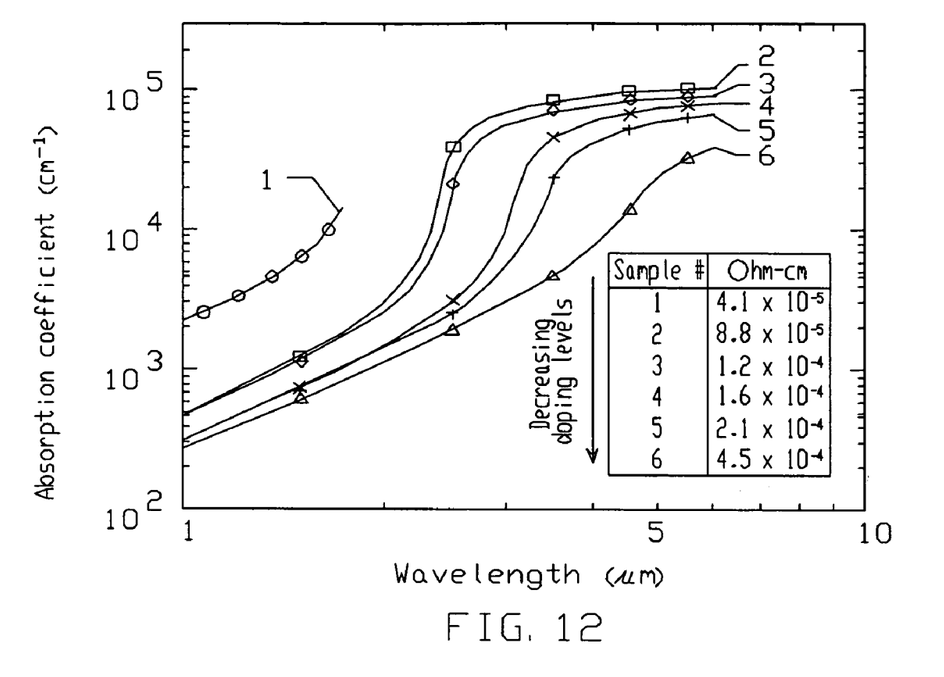
FIG. 12 is a graph showing absorption coefficients versus wavelength for CdO:In films per the present invention which have various resistivities.

As indicated above, a second important property of the infrared transparent doped CdO films is the resistivity of the films. While an undoped CdO film prepared by this method will have a resistivity of about $1.45 \times 10^{-3}$ Ω-cm, a significant reduction of resistivity to about $5 \times 10^{-4}$ Ω-cm can be obtained by adding as little as 0.05% indium, and this can be further reduced to about $0.5 \times 10^{-4}$ Ω-cm by increasing the dopant concentration to 2.0%. Another basis for comparison of various optical materials is the absorption coefficient, α, which is defined above. The absorption coefficient is a measure of how well a material absorbs light of a certain wavelength. A graph plotting absorption coefficient vs. wavelength for films with six different resistivities is shown in FIG. 12. As can be readily seen, absorption increases with increasing doping levels.

Indium-doped CdO films deposited by PLD show electrical and optical properties superior to those grown by other techniques previously reported. The following list tabulates the properties of films made in accordance with the present invention, as might be used in various types of devices. Absorption loss (best value) of other transparent conductive materials and CdO films grown by other techniques with the same sheet resistance are listed in the parenthesis for comparison.

| Spectral region | Wavelength (µm) | Resistivity (Ω-cm) | Sheet resistance (Ω/□) | Absorption loss |
|---|---|---|---|---|
| SWIR | 1-2 | $<5 \times 10^{-4}$ | ≦200 | <0.7% (4%) |
| SWIR | 1-2 | $<5 \times 10^{-4}$ | ≦20 | <2.0% (70-80%) |
| MWIR | 3-5 | $<5 \times 10^{-4}$ | ≦11 | <10-25% (>40%) |
| LWIR | 8-12 | $<5 \times 10^{-4}$ | ≦21 | <15-40% |

Figure 13:
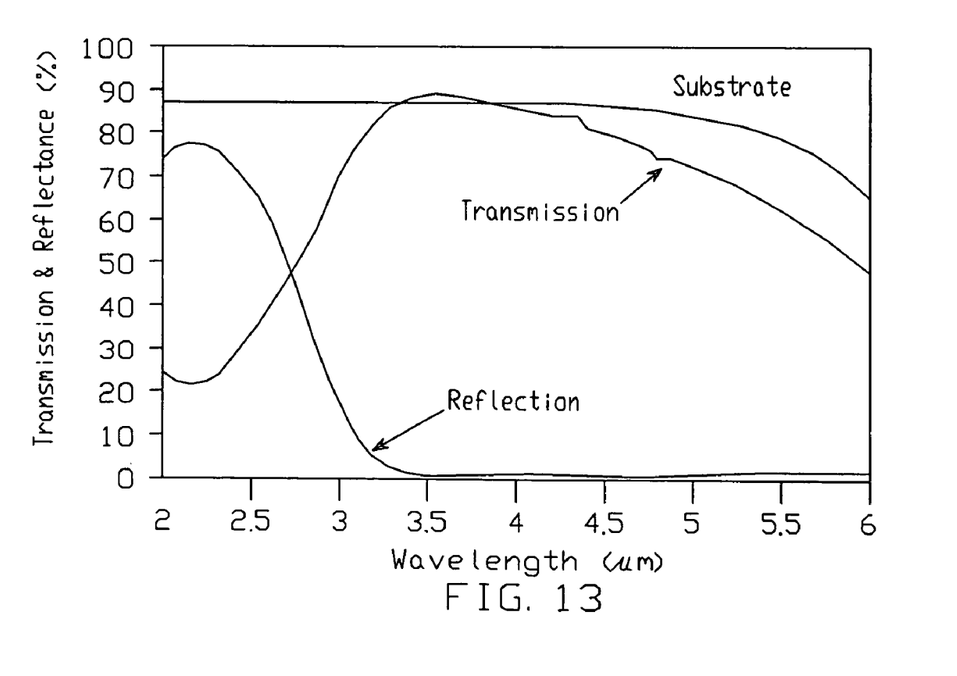
FIG. 13 is a graph showing transmission and reflectance versus wavelength for one embodiment of a CdO:In film per the present invention.
Figure 14:
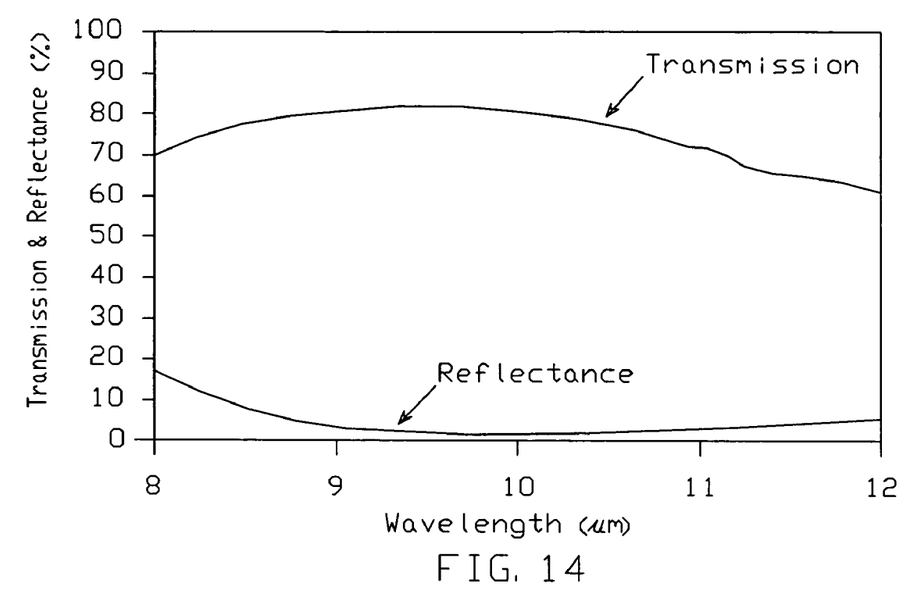
FIG. 14 is a graph showing transmission and reflectance versus wavelength for another embodiment of a CdO:In film per the present invention.

FIGS. 13 and 14 show the transmission of two films used as IR transparent RF shields. These films are incorporated into an AR coating to minimize the reflective loss; an AR coating has also been added to the backside of the substrates. The coating designs were optimized for operation in the 3-5 µm wavelength range (FIG. 13) and the 8-12 µm wavelength range (FIG. 14). Absorption losses in these ranges are <25% and <40% for the 3-5 µm and 8-12 µm spectral ranges, respectively, with sheet resistances of 11 and 21Ω/□, respectively; the films in FIGS. 13 and 14 have thicknesses of about 1000 Å and 600 Å, respectively. FIG. 13 also shows the transmission of the uncoated sapphire substrate. Designs with higher sheet resistances would have proportionally less absorption loss. Other traditional transparent conductive films, such as $SnO_2$, ITO, ZnO, and their combinations, with comparable sheet resistances, are more absorbing at these wavelengths.

PLD not only produces CdO films with high activation of the dopants (i.e. indium or other elements) to increase its electrical conductivity, it also significantly improves the film's structural quality. One example is the present film's exceptionally thin transition layer (sometimes referred to as a "dead layer") at the interface between the grown film and substrate. A dead layer has very poor quality, with low electron mobility and high electrical resistivity. A thick dead layer will therefore increase a film's optical loss without contributing to its electrical conducting characteristics.

Figure 15:
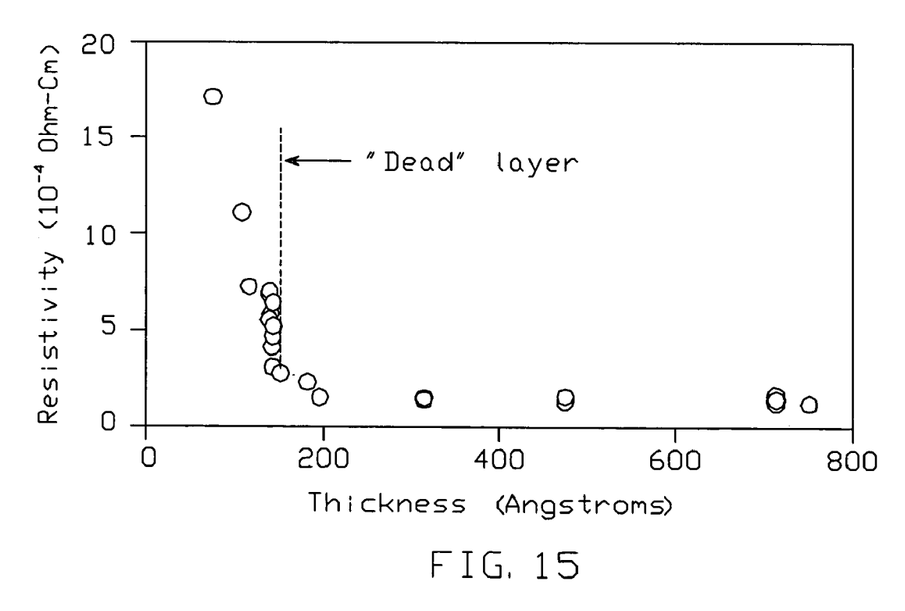
FIG. 15 is a graph showing resistivity versus thickness for a CdO:In film per the present invention.

However, for the present film, the combination of PLD and doped CdO results in a dead layer that is only approximately 100-200 Å thick (see FIG. 15). Due to the dead layer's exceptional thinness, it has little effect on the film's optical absorption characteristics. For films having higher sheet resistances, a thin dead layer is critical to achieving the properties listed above.

Figure 16:
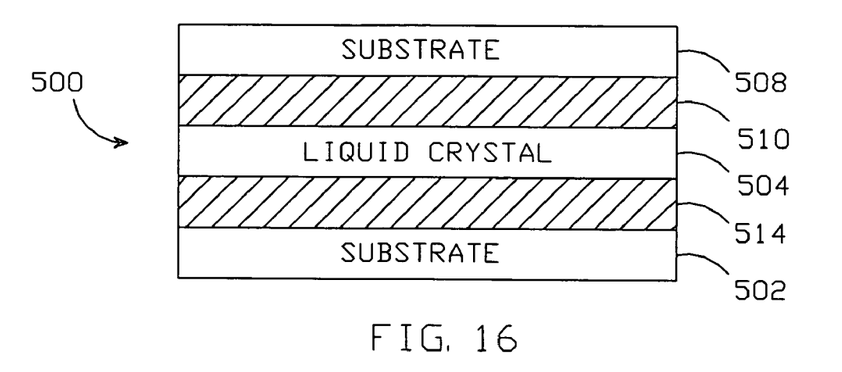
FIG. 16 is a cross-sectional view of an embodiment of a liquid-crystal-based device incorporating a CdO:In film per the present invention.

One application of the doped CdO films is for transparent conductive electrodes for liquid crystal cells used in optical beam steering, spatial light modulators, and optical switches operating in the SWIR and MWIR ranges. A first embodiment of a device incorporating features of the invention, shown in FIG. 16, comprises a multilayer structure 500 which has a first transparent substrate 502, a liquid crystal layer 504 sandwiched between the first substrate 502 and a second substrate 508 which may also be transparent. A first electrode layer 510 is positioned between second substrate and liquid crystal layer 504, and a second electrode layer 514, a transparent doped CdO film as described herein, is positioned between first substrate 502 and liquid crystal layer 504. Other thin film layers, such as index matching or alignment layers, may also be located between the substrates. The liquid crystal layer 504 is preferably ordered in the nematic state in the absence of having a voltage applied between the electrode layers 510 and 514. It may alternatively be ordered in a twisted nematic state or cholesteric phase. A device so arranged can be used as a spatial light modulator, a beam steering device, or an optical switch. Devices fabricated using prior art conductive, transparent electrodes are limited to use with wavelengths of <1 μm. By replacing the prior art electrode materials with doped CdO in accordance with the present invention, the device can now be used in the SWIR and MWIR ranges and have acceptable absorption losses.

In certain applications, conductive transparent films of doped CdO as described herein can be used to prevent the transmission of radio frequency interference from optical systems. In this application, the film is coated onto a transparent window surface. The infrared signal is transmitted while longer wavelength radio frequency signals (>10 MHz, e.g.) are reflected as the result of the conductivity of the film.

VCSELs (Vertical Cavity Surface Emitting Lasers) are a class of solid-state laser that can be fabricated on a semiconductor wafer by batch processing to produce a dense two-dimensional array of lasers whose optical outputs are perpendicular to the substrate. These devices are small with low power consumption, fast, and vital to optical communication systems.

Figure 17A:
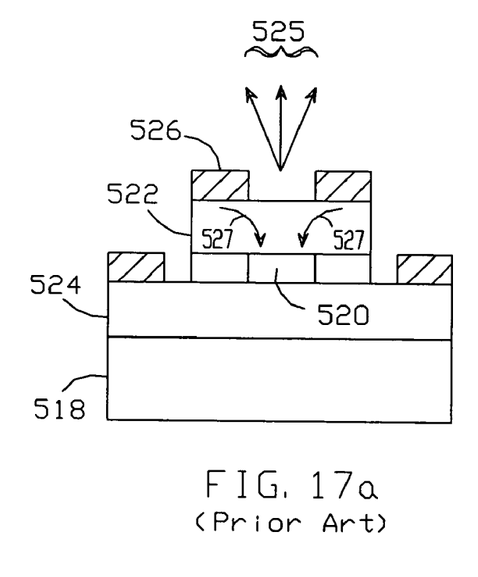
FIG. 17a is a cross-sectional view of a prior art embodiment of a VCSEL device.
Figure 17B:
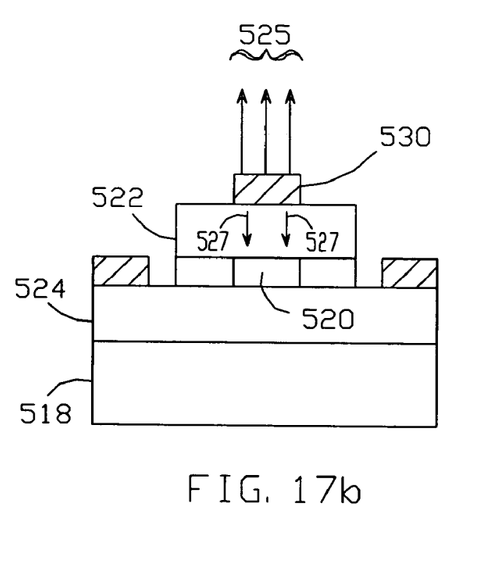
FIG. 17b is a cross-sectional view of an embodiment of a VCSEL device incorporating a CdO:In film per the present invention.

Schematic cross sectional views of a prior art "top emitting VCSEL" and a top emitting VCSEL which employs a film in accordance with the present invention are shown in FIGS. 17a and 17b, respectively. The entire device is fabricated from a multiple layered material structure grown on a substrate 518. An active area 520 where the lasing action takes place is sandwiched between top and bottom Dielectric Bragg Reflectors (DBR) 522, 524 that act as front and rear mirrors to define an optical cavity. In a top emitting VCSEL, the bottom DBR is nearly 100% reflective while the top DBR has lower reflectivity so that a lasing beam 525 can emit from the top. Ideally, it is desirable to use a thin film material with high electrical conductivity and optical transmission at the wavelengths of interest, typically 1.3 and 1.5 μm for optical communication as an electrode. However, because of the lack of such a material, the traditional approach is to use a gold (Au) ring 526 as the top electrode, as shown in FIG. 17a. Electrical current 527 is injected from the ring around the peripheral area of the device and diffuses toward the center to the active region 520 to cause lasing. This approach tends to limit device size, since the large device size may cause nonuniform current density, which can cause poor output beam quality. This problem can be solved by locating a doped CdO thin film per the present invention directly onto the top of the optical beam exit area as the top electrode. The injected current 527 will be uniform to produce better optical beam quality. The power consumption will also be lower.

Figure 18A:
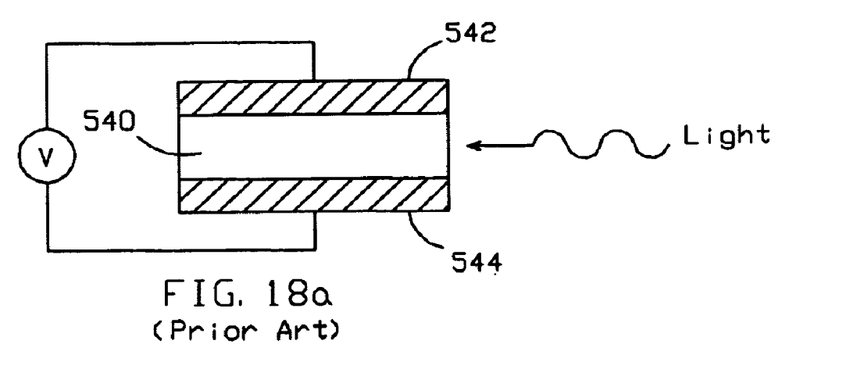
FIG. 18a is a cross-sectional view of a prior art embodiment of a ferroelectric device.
Figure 18B:
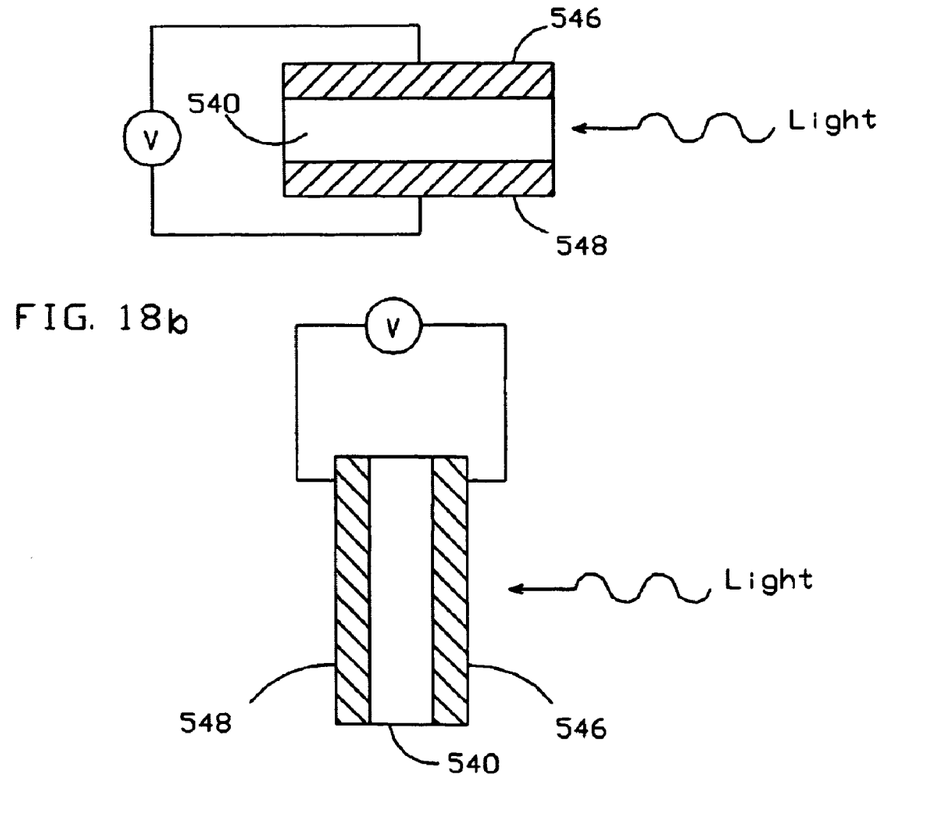
FIG. 18b is a cross-sectional view of an embodiment of a ferroelectric device incorporating a CdO:In film per the present invention.

Ferroelectric devices, including, for example, ferroelectric memory devices, electro-optical devices, and piezoelectric devices, represent another class of devices which may benefit from the use of a doped CdO film per the present invention; a prior art electro-optical ferroelectric device and an electro-optical ferroelectric device in accordance with the present invention are shown in FIGS. 18a and 18b, respectively. Ferroelectric devices are fabricated from slabs 540 of ceramic or single crystal materials, and require low resistivity electrodes on opposite faces for "poling" the material and modulating its properties. Traditional electrodes 542, 544 are made from platinum or other metal films. Because of the chemical and structural incompatibility between the metal and the ferroelectric materials—which are mostly oxides with a peroveskite lattice structure—repeated switching can cause ferroelectric material fatigue as the polarization decreases with increasing operating cycles. Structurally, the interface can degrade to cause eventual delamination and detachment. The use of the present doped CdO thin film 546, 548 can reduce this problem because the matched chemical properties of oxides and the similarity of its lattice structure (cubic structure) to the peroveskite lattice of the ferroelectric materials.

Another advantage offered by using the doped CdO electrode in an electro-optical device fabricated from a single crystal ferroelectric material is that light can now transmit through the electrodes 546, 548 in the direction along the polarization of the crystal, as well as in the direction perpendicular to the direction of polarization inside the crystal. In the case of using metal electrodes 542, 544 (FIG. 18a), the light propagation must be in the direction from the side of the crystal and perpendicular to the direction of polarization inside the crystal. Electro-optical devices using the doped CdO electrode can operate in the 1.3 and 1.5 micron wavelength ranges with little absorption loss.

Another type of device which may benefit from the use of a doped CdO film per the present invention is a Pockels' cell, which is an electro-optic device in which birefringence is modified under the influence of an applied voltage. If the birefringent medium is a solid, then the applied voltage is normally applied using transparent, electrically-conductive films applied on both sides of the solid. If the birefringent medium is a liquid, then transparent, electrically-conductive films are applied on the inside of the window used to confine the liquid.

Figure 19A:
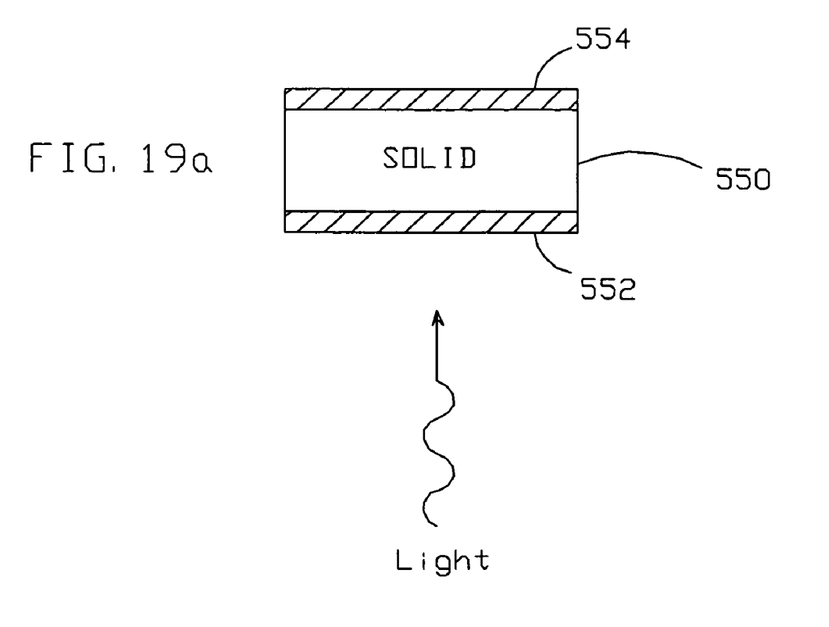
FIG. 19a is a cross-sectional view of an embodiment of a Pockels' cell device incorporating a CdO:In film per the present invention.
Figure 19B:
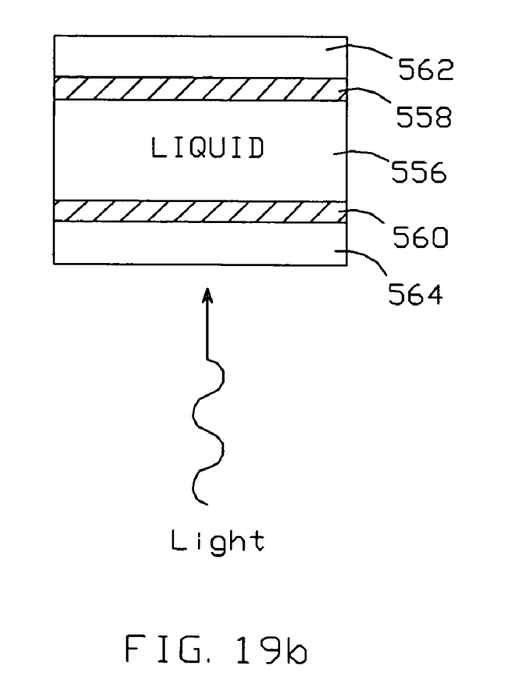
FIG. 19b is a cross-sectional view of another embodiment of a Pockels' cell device incorporating a CdO:In film per the present invention.

FIG. 19a illustrates an arrangement for a Pockels' cell in which the birefringent medium 550 is a solid. The light must pass through the two doped CdO film electrodes 552, 554 that modify the birefringence. FIG. 19b shows an arrangement for a Pockels' cell in which the birefringent medium 556 is a liquid. Here, the two doped CdO film electrodes 558, 560 that apply the voltage to the liquid are applied on the inside of window layers 562, 564.

Yet another possible application of a doped CdO film per the present invention is with optical micro-electromechanical devices (MEM devices), in which a transparent electrode is used as part of the activation mechanism for the device's electrostatic actuator. There could be many different MEM device embodiments, including, for example, a multi-faceted focusing mirror, or a variable-wavelength filter or reflector.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. An electrically conductive, infrared transparent film comprising CdO doped with at least one element from the group consisting of boron, aluminum, gallium, indium, thallium, bismuth, fluorine, or hydrogen (as a co-dopant), such that the structure of the resulting doped film has an absorption loss of less than 20% at wavelengths of 1-12 μm, a sheet resistance of <600Ω/□, and a resistivity of less than $5 \times 10^{-4}$ Ω-cm, wherein the concentration of said dopant is between 0.05% and 6% by weight.

2. The film of claim 1, wherein said film comprises CdO doped with indium.

3. An electrically conductive, infrared transparent film comprising CdO doped with at least one element from the group consisting of boron, aluminum, gallium, indium, thallium, bismuth, fluorine, or hydrogen (as a co-dopant), the doped film having an absorption loss of less than 20% at wavelengths of 1-12 μm, a sheet resistance of <600Ω/□, and a resistivity of less than $5 \times 10^{-4}$ Ω-cm, further comprising a substrate on which said film is grown, said film including a transition layer at the interface between the grown film and substrate, said transition layer being 100-200 Å thick.

4. The film of claim 1, further comprising:
a first substrate layer that is substantially transparent to the light incident thereon, said first substrate having a first and second surface, said electrically conductive, infrared transparent film on the second surface of the first substrate;
a second substrate layer having a first and second surface;
a second electrically conductive layer on the second surface of the second substrate; and
a layer of liquid crystal material disposed between the second surfaces of said first and second substrate layers;
said first substrate layer, said electrically conductive, infrared transparent film, said second substrate layer, said second electrically conductive layer, and said layer of liquid crystal material forming a device for modifying the optical phase of incident light.

5. The film of claim 4, wherein said liquid crystal layer is ordered in the nematic state in the absence of having a voltage applied between said electrically conductive, infrared transparent film and said second electrically conductive layer.

6. The film of claim 4, wherein said liquid crystal layer is ordered in the twisted nematic state in the absence of having a voltage applied between said electrically conductive, infrared transparent film and said second electrically conductive layer.

7. The film of claim 4, wherein said liquid crystal layer is ordered in the cholesteric phase in the absence of having a voltage applied between said electrically conductive, infrared transparent film and said second electrically conductive layer.

8. The film of claim 4, wherein the second substrate layer is substantially transparent to light incident on the device.

9. The film of claim 1, further comprising:
a substrate;
a bottom dielectric bragg reflector (DBR) on said substrate;
an electrical contact contacting a portion of said bottom DBR; and
a top dielectric bragg reflector (DBR) which is above and separated from said bottom DBR such that said top and bottom DBRs act as front and rear mirrors to define an optical cavity, said electrically conductive, infrared transparent film on said top DBR and providing an electrical contact to said top DBR;
said substrate, said bottom DBR, said electrical contact, said top DBR, and said electrically conductive, infrared transparent film forming a top emitting vertical cavity surface emitting laser (VCSEL).

10. The film of claim 1, further comprising:
a ceramic or single crystal slab having top and bottom sides, respective ones of said electrically conductive, infrared transparent films on the top and bottom sides of said slab, said electrically conductive, infrared transparent films forming first and second electrodes for "poling" the slab material and modulating its properties, said slab and said electrically conductive, infrared transparent films forming a ferroelectric device.

11. The film of claim 1, further comprising:
a material whose birefringence changes, said material sandwiched between first and second ones of said electrically conductive, infrared transparent films, said first and second electrically conductive, infrared transparent films forming first and second electrodes, said material whose birefringence changes and said first and second electrically conductive, infrared transparent films forming a Pockels' cell.

12. The film of claim 11, wherein said material whose birefringence changes is solid.

13. The film of claim 11, wherein said material whose birefringence changes is liquid, further comprising first and second window layers arranged to confine said liquid, said first and second electrically conductive, infrared transparent films applied to the liquid side of said first and second window layers, respectively.

* * * * *